(12) United States Patent
Navas-Roch

(10) Patent No.: US 11,327,557 B2
(45) Date of Patent: May 10, 2022

(54) SKIN INTERFACE SYSTEM

(71) Applicant: Alberto Navas-Roch, Beaconsfield (CA)

(72) Inventor: Alberto Navas-Roch, Beaconsfield (CA)

(73) Assignees: Carlos Birlain, Beaconsfield (CA); Alberto Navas-Roch, Beaconsfield (CA)

(*) Notice: Subject to any disclaimer, the term of this patent is extended or adjusted under 35 U.S.C. 154(b) by 0 days.

(21) Appl. No.: 16/812,157

(22) Filed: Mar. 6, 2020

(65) Prior Publication Data

US 2020/0285305 A1 Sep. 10, 2020

Related U.S. Application Data

(60) Provisional application No. 62/815,483, filed on Mar. 8, 2019.

(51) Int. Cl.

| | |
|---|---|
| *G06F 3/01* | (2006.01) |
| *G05G 5/03* | (2008.04) |
| *H01L 41/09* | (2006.01) |
| *G09B 21/00* | (2006.01) |

(52) U.S. Cl.
CPC .............. *G06F 3/011* (2013.01); *G05G 5/03* (2013.01); *G06F 3/016* (2013.01); *G09B 21/003* (2013.01); *H01L 41/094* (2013.01); *A63F 2300/1037* (2013.01)

(58) Field of Classification Search
None
See application file for complete search history.

(56) References Cited

U.S. PATENT DOCUMENTS

| | | | |
|---|---|---|---|
| 6,275,213 B1* | 8/2001 | Tremblay | G06F 3/011 345/156 |
| 10,948,370 B2* | 3/2021 | Cook | G09B 21/004 |
| 2013/0019374 A1* | 1/2013 | Schwartz | A61F 13/10 2/69 |
| 2016/0296838 A1* | 10/2016 | Goetgeluk | A63F 13/285 |
| 2017/0193766 A1* | 7/2017 | De Luca | G08B 6/00 |

OTHER PUBLICATIONS

Sodhi et al., AIREAL: Interactive Tactile Experiences in Free Air, Jul. 2013, ACT Transactions, vol. 32, No. 4, Article 134 (Year: 2013).*

* cited by examiner

*Primary Examiner* — Carlos Garcia
(74) *Attorney, Agent, or Firm* — Brouillette Legal Inc.; Robert Brouillette

(57) ABSTRACT

A micro piezo-electric air valve is used to form a skin interface system composed by a matrix of valves interconnected that bring temperature and touch sensorial experience to people through the skin's tactile, pressure and temperature biological sensors by means of micro air jet formations and/or air bubble formations over the skin. The piezo-electric air valve is specially designed to sensitize a small area of the skin of the user by quickly delivering a specific volume of air following a selected pattern, for example a pixel of an image that is processed by a computer system and converted into electric signal that opens or closes the piezo-electric air valve causing the air to flow. Such a skin interface system can be used by blind people to interpret a scene in front of them when using a video camera. or for use as a suit for therapeutic use and gaming.

13 Claims, 23 Drawing Sheets

SKIN INTERFACE SYSTEM

FIELD OF THE INVENTION

The present invention generally relates to skin interface systems which may be used for various purposes including, gaming, virtual reality, therapeutic treatments, relaxation, pet control, training and image recognition systems to assist blind people and help them recognize their environment by "seeing" it throughout the skin.

BACKGROUND OF THE INVENTION

A large number of sensors exist which read physiological data by applying the sensor to the skin of humans or animals.

This invention relates to the reverse, being the generation of sensations on the skin which can be interpreted by the user for various purposes including, gaming, virtual reality, therapeutic treatments, relaxation, pet control, training and even image recognition systems to assist humans, especially blind people, and help them recognize their environment by "seeing" it throughout the skin.

Various systems exist to create tactile sensations on the skin of users. Many of them are used as hand operated interfaces used with computerized games, robotic arms or other applications.

European patent application EP 1 121 927 describes a sensate chemical composition including at least one cooling sensate, warming sensate and tingling sensate. The tingling sensate is at least one of Jambu Oleoresin™ and Spilanthol™. It is further directed to a method of using the sensate composition in a food, pharmaceutical or personal care products.

U.S. Pat. No. 5,709,219 describes a system for providing haptic information to the hand of a human operator. The system utilizes display devices that dynamically convey touch sensations to the human operator, thereby creating various tactile sensations such as texture and slippage.

PCT application PCT/US1991/000632 describes a man-machine interface and in particular to an interface that measures body part positions and provides force and texture feedback to a user.

U.S. Pat. No. 5,565,840 describes a tactile sensation generator capable of producing tactile sensations to a video game player corresponding to activity portrayed in a video game. The tactile sensation generator contains a vest or harness for maintaining a flexible pad proximate a player's body. The pad contains one or more actuators, e.g., a solenoid or vibratory motor embedded in the pad. Each actuator interacts with the wearer and is individually activated to produce a localized tactile sensation, e.g., an impact vibration, corresponding to the action simultaneously portrayed by the video game on a computer screen or television. These actuators can be solenoids, piezo-electric actuators, electro-mechanical buzzers or vibrating motors. The sensation on the skin is created by a vibration generated by the actuator.

U.S. Pat. No. 6,275,213 describes a virtual reality system using vibratory devices to provide feedback to the user. The vibratory devices may be powered by air or gas but the air or gas is not directly creating a sensation on the skin.

Systems for the Blind

In order to help the blind identify that which they cannot see, it is known to use the creation of tactile or sonorous relief. With regard to tactile material, the base method is of course the method developed by Louis Braille.

There have also been developed Braille terminals composed of at least a row of Braille cells, or multiple rows of Braille cells, each cell being constituted by eight points each of which can move between a retracted position and a raised position. These devices make it possible, for example, to read a book by interpretation of each letter of each word as the letters appear on a cell.

Also known in the prior art are methods enabling the blind to perceive graphic representations by means of hand-held sensory stimulators.

There was developed, for example, in 1941 a device which was the object of the American patent no. U.S. Pat. No. 2,327,222, issued in 1943. This device comprises a certain number of points so as to enable a blind person to perceive a fixed image.

There was also developed in 1954 a device which was the object of Swiss patent no. CH325 289, published in 1957. This device has as object the enabling of reporting by means of mobile points a relief perceived by a set of sensors.

German Patent Publication DE3901023 teaches an optical scanner 11 mounted in a hand-held device having a braille output matrix 5. The device is scanned across printed text which is "read" and "recognized" by a computer 3 and converted to braille for output to the user. No provision is made for handling non-text graphics and icons.

U.S. Pat. No. 4,687,444 teaches a tape "reader' which converts text encoded onto a magnetic tape into braille output matrix 24. The tape is read into a buffer. The buffer is then read out to a braille matrix. The tape is commonly encoded in a braille code and can be amplified to drive the matrix actuators directly. Reading of the buffer is controlled by moving a mouse similar to those used with computers but there is only a horizontal distance output to control buffer addressing.

U.S. Pat. No. 5,186,629 teaches a computer mouse having tactile feedback to be used with audio computer output to provide a virtual graphic display to blind computer users. The mouse and audio feedback allow blind computer users to visualize computer graphic images and multiple screen windows in much the same way as these forms of computer output are visualized by persons with sight.

Many other computer-controlled or assisted reading apparatus have been proposed, which have been specially designed as an aid to exploration of graphical objects or images displayed on the screen of a computer for users. However, existing devices do not make possible an interactivity of the user enabling him/her to move into a real 3D environment while perceiving object and boundaries.

A method for enabling at least a user, in particular a blind user, to perceive a shape and device therefor is described in U.S. patent application publication no, US2004/0241623. A tactile stimulation system representing an image is explored with the free hand (while the other hand manipulates a joystick). The tactile stimulation system consists of two contiguous cells of 8 points each, which provides a small matrix of 16 points on a little more than 1 cm.

A device, called the Opticon™, from Telesensory Company in Mountain View Calif., has the capability of translating the area surrounding the display cursor into a matrix of pins such that contrasting areas of the display will map to vibration of certain of the pins. The user places a finger of one hand on the pin matrix and the other hand holds and moves a mouse that causes the cursor to move about the display.

The original concept for the Opticon™ used a video camera that the user would scan across a paper document and then evolved thru camera lens changes to an ability to physically scan across a computer display. Further evolution was the substitution of a mouse driven cursor for the handheld camera. The pin matrix, however, remained a separate device that is touched by a finger of the other hand.

The blind user requires a more sophisticated approach to interaction with his/her environment especially when the information presented is free flowing, non-restrained, and particularly non-character representations.

It is possible to "read" letters and figures written on our skin by another person, the brain has great capacity to train and learn to interpret haptic signals of greater precision and speed received on any part of the skin enough sensitive.

Actually, in the case of braille, fingers are used as read heads for capturing information from a sequence of symbols written in a physical format that sensitizes the skin.

However, the existing skin feedback systems have low resolution and can only provide limited feedback to the user.

SUMMARY OF THE INVENTION

The present invention generally relates to an improved skin interface system which may be used for various purposes, including:
a. sensitize the skin of the user with temperature tactile and pressure sensations.
b. therapeutic treatments to help stimulate/relax the patient following specific patterns and sequences.
c. pet control and training by sending skin-sensitive instructions using a mobile phone to the body suit, user can control the pet by sensitizing its skin from the distance.
d. relaxation by drawing patterns on the mobile phone or tablet that are sent to the sensorial suit.
e. image recognition systems to assist blind people and help them recognize their environment by "seeing" it throughout the skin.

The proposed system consists of a device that uses computer and electronic systems capable of transmitting images and patterns to the user captured by video cameras or created by humans or computer-generated imagery systems (CGI) in a new bio-mechanical transmission format.

This bio-mechanical transmission format bases its operation on the capability of the receptors of the cells of the user's nervous system to capture micro electrical, tactile, pressure and temperature signals applied on the surface of the skin by means of small micro-air-jet actuators.

These actuators, which are inventive in themselves, are mounted in the form of a bi-dimensional matrix and enclosed into a specially designed cloth that can cover a selected part of the body and eventually the entire body like a suit, will mechanically transmit the light and movement patterns captured by the video cameras or generated by CGI directly to the nerve receptors of the skin.

The continuous feed of the image patterns right on the system will create a full tactile and pressure sensation on the skin in contact with such cloth that user can interpret in different ways depending on the context of the experience.

In the context of a virtual reality game, the user can be immersed into the game experience and perceive the sensations that the 3D virtual scenario has already programmed for such case like walking into virtual water and perceiving the water climbing up the legs or feeling the touch sensation of another player virtually touching the user on any part of the body or feeling cold shivers. The virtual reality experience requires that a developer kit is made for programmers to create such experiences in users.

In the context of a therapeutic treatment, the special cloth equipped with this technology can draw pressure and tactile patterns specially designed to create therapeutic massage mapped over the skin of the user with specific feed of sequences of images that user feels on the skin and perceives like real massages. The automated process can be programmed in a computer system and can allow the user to select the desired experience.

In the case of legally or fully blind individuals, after some training, users of such system could experience three-dimensional images transmitted to their nervous system by using the cloth, object of this invention.

In a certain way the micro-air-jet matrix of the invention will be a transmitter of the user's visual environment, and the skin in contact with it will be its read head for the nervous system of the users allowing them to interact and explore the surroundings with a real-time visual feed.

The invention's scientific approach is based on three important assumptions:
a. The user has the ability to understand moving images projected on the skin.
b. The user has the ability to understand such information in very low resolution.
c. By perceiving a still image through the eyes, we can analyze and locate the objects that compose it, their apparent shape, color and brightness. We can even guess their composition by analyzing light reflections on their surface. The higher is the resolution of the image the more details we can get.

However, it is likely that we are only interested in knowing how the objects are distributed in front of us, so as not to trip over them. In that case, we will not be interested in analyzing its composition or color, we will not even be interested in knowing what objects are because we already know from the experience what they are, or because we have received enough information through other senses.

The most valuable information will be their relative location with respect to the subject, and their size. Considering this point, high resolution is not a must. Actually, what we need is a high image refresh rate that brings constant and intense feed for better environment perception and understanding.

Video films can be really low resolution compared to the still images captured by digital photo cameras. However, the 25 images per second of the video transmitted to our brain through our eyes produce a high-quality three-dimensional vision of the scenario which is perfectly intelligible. Our brain has enough information to understand the scene and the central object of the scene even if the video is offered in very low resolution (320×200 for instance).

This approach is what the invention uses to transmit moving images to our brain. Low resolution and high image refresh rate with minimal delay from capture to its projection on the user's skin.

Other and further aspects and advantages of the present invention will be obvious upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

The above and other aspects, features and advantages of the invention will become more readily apparent from the following description, reference being made to the accompanying drawings in which.

DETAILED DESCRIPTION OF AN EMBODIMENT OF THE INVENTION

Figure 1:
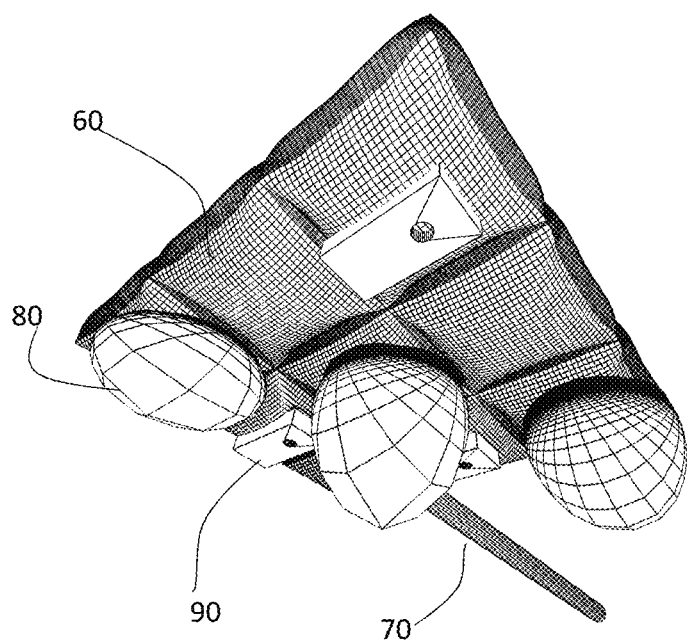
FIG. 1 is a bottom perspective view of an embodiment of the invention comprising micro piezo air valves for touch and pressure facing the skin of a user.
Figure 2:
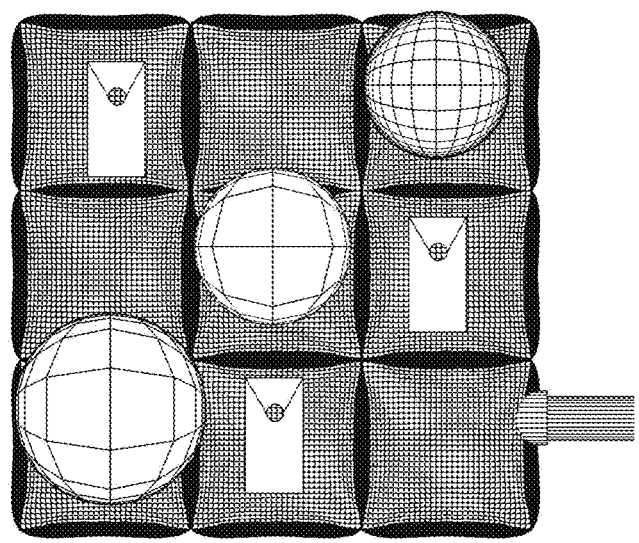
FIG. 2 is a bottom view of the embodiment of FIG. 1.
Figure 3:
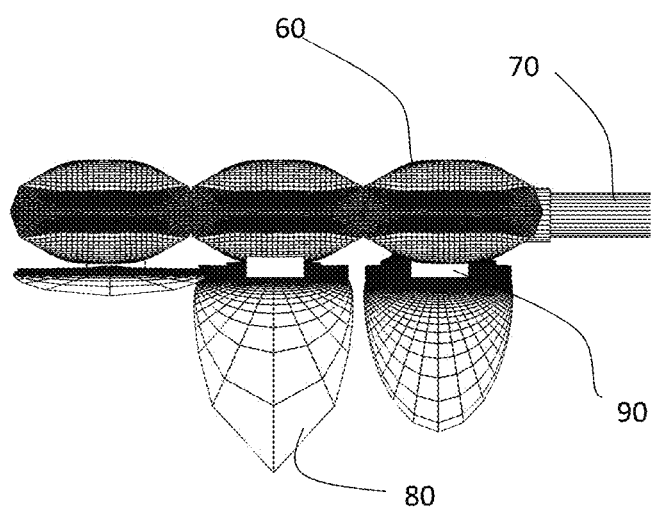
FIG. 3 is a side view of the embodiment of FIG. 1, wherein bubbles can be seen inflated at varying degrees.
Figure 4:
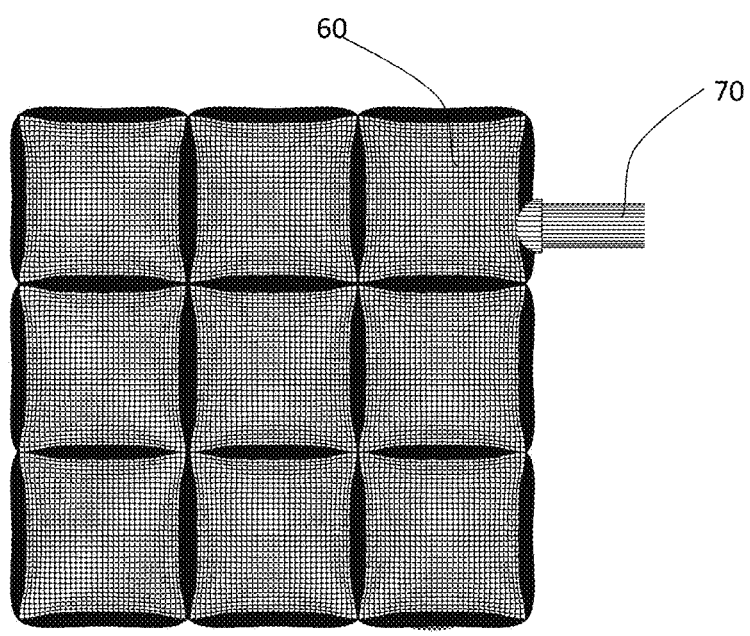
FIG. 4 is a top view of the embodiment of FIG. 1, facing opposite to the skin of the user.
Figure 5:
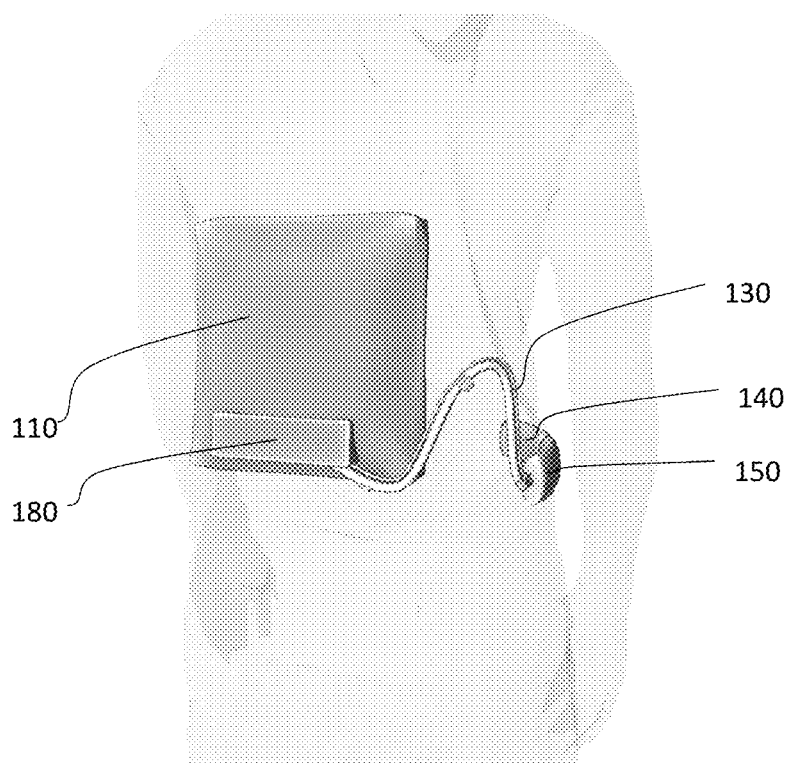
FIG. 5 is a back perspective view of an embodiment of the invention comprising a body suit installed on a user.
Figure 6:
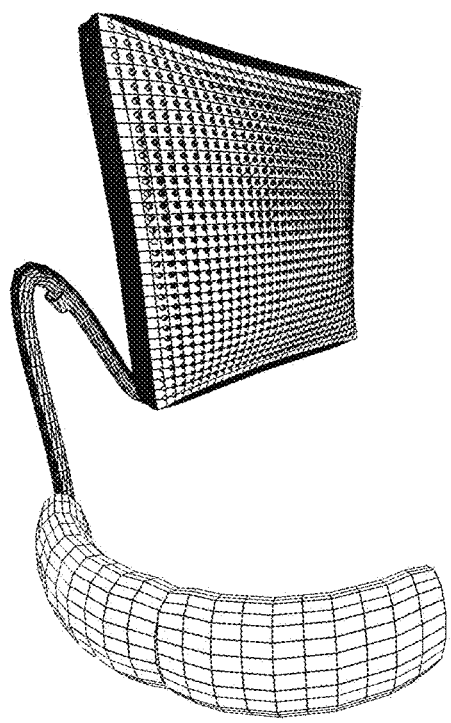
FIG. 6 is a front perspective view of the embodiment of FIG. 5 not installed on a user.
Figure 7:
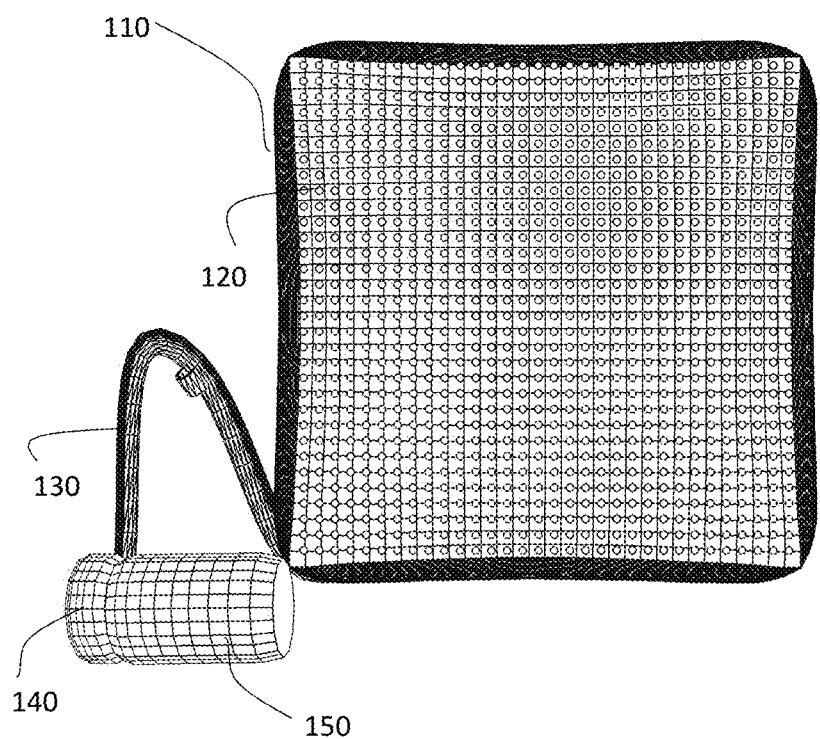
FIG. 7 is a front view of the embodiment of FIG. 6.
Figure 8:
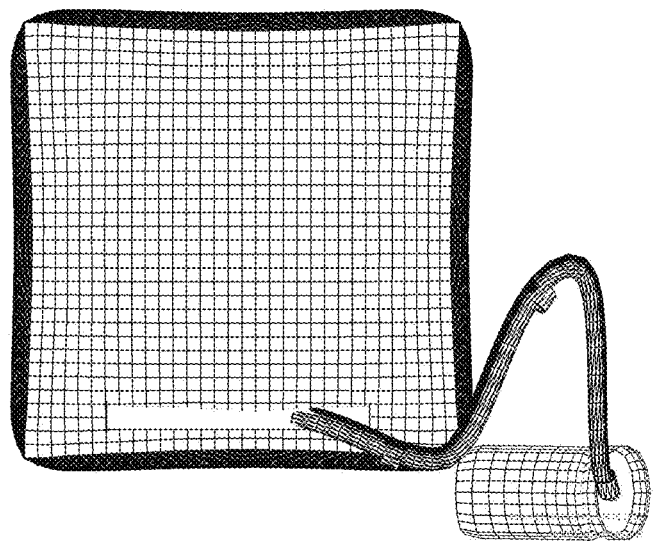
FIG. 8 is a back view of the embodiment of FIG. 6.
Figure 9:
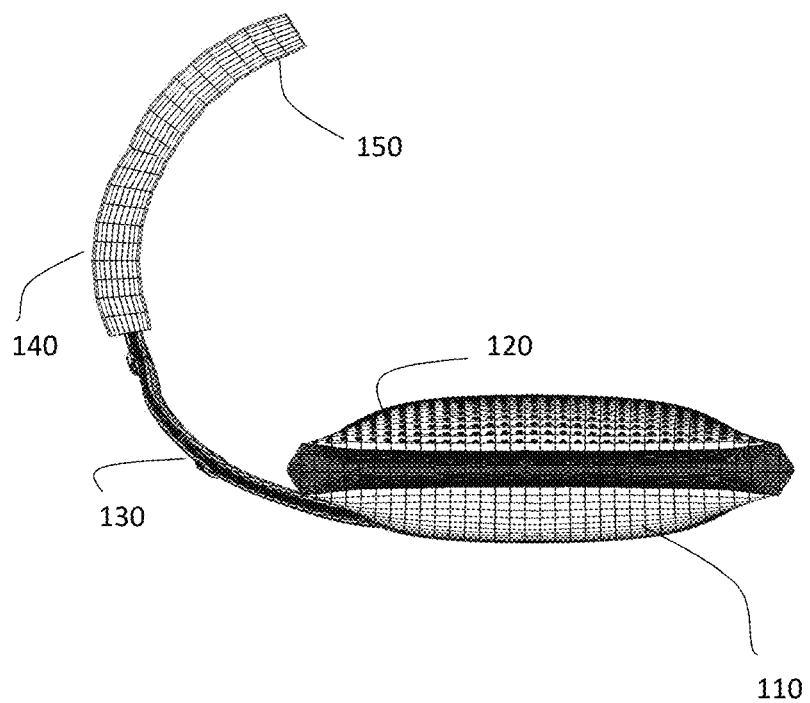
FIG. 9 is a bottom view of the embodiment of FIG. 6.

A novel Skin Interface System will be described hereinafter. Although the invention is described in terms of specific illustrative embodiments, it is to be understood that the embodiments described herein are by way of example only and that the scope of the invention is not intended to be limited thereby.

An embodiment of the invention is shown in FIGS. 1 to 4 which comprises a special cloth 60 made of two layers of fabric that retain pressurized air in between. A first layer may be in direct contact with the skin of a user wherein the other is opposite to the first. The cloth 60 may be equipped with a mesh or matrix composed of two categories of small actuators, a first providing tactile and temperature feedback and a second providing pressure feedback. The tactile-temperature actuator may essentially be a micro piezoelectric valve 90 that projects air jets over the skin of a user through the inside layer of the cloth in direct contact with the body. The pressure actuator may essentially be a small bubble 80 made of an elastic fabric that inflates or deflates using a micro piezoelectric air jet valve 90. It can be appreciated from the description that the second actuator comprise the same aspects of the first actuator, only that an elastic fabric may further be installed on top. As both actuator categories may work with similar piezoelectric valves 90, it may be possible to easily manufacture different actuators positioning over a cloth surface 60 to obtain different types of haptic feedback configurations.

As the first category of actuator projects air over the skin, a user may locate the signal thanks to its biologic sensors of temperature and touch. Similarly, the second category of actuator provokes pressure which may also be located by the biologic sensors of touch when the bubble 80 is inflated by the micro air-jet piezoelectric valve 90. The speed of the inflation process and the growth level reached by the bubble 80 may determine the intensity of the pressure. Consequently, the pressure actuators may provide varying levels of pressure by controlling the level of activation of the under positioned micro air-jet piezoelectric valves 90.

A homogeneous distribution of both actuators along the special cloth 60 in mathematical bi-dimensional order may help to sensitize the skin of a user in selected areas of the body.

The system may then be connected to a computer that activates or deactivates actuators individually across the entire mesh according to the index or mathematical order of each one following patterns determined by the software.

Such software may follow instructions of therapeutic treatments to help stimulate patients with specific disorders or may follow the instructions of a virtual reality game to help simulate scenarios over the skin of the user.

A high pressure air tube 70 may supply the cloth cell 60 and its respective air valves 90 with enough air to properly function.

Another embodiment of the invention is shown in FIGS. 5 to 9. This embodiment is composed of a body-suit which may be equipped with both actuators of the embodiment of FIGS. 1 to 4, but may preferably be installed simply with micro air-jet piezoelectric valves 90, and further comprises a compressed air supply 140, a power supply 150, a main compressed air and electricity supply hose 130 and a computer system capable of locating, activating or deactivating actuators individually.

Figure 10:
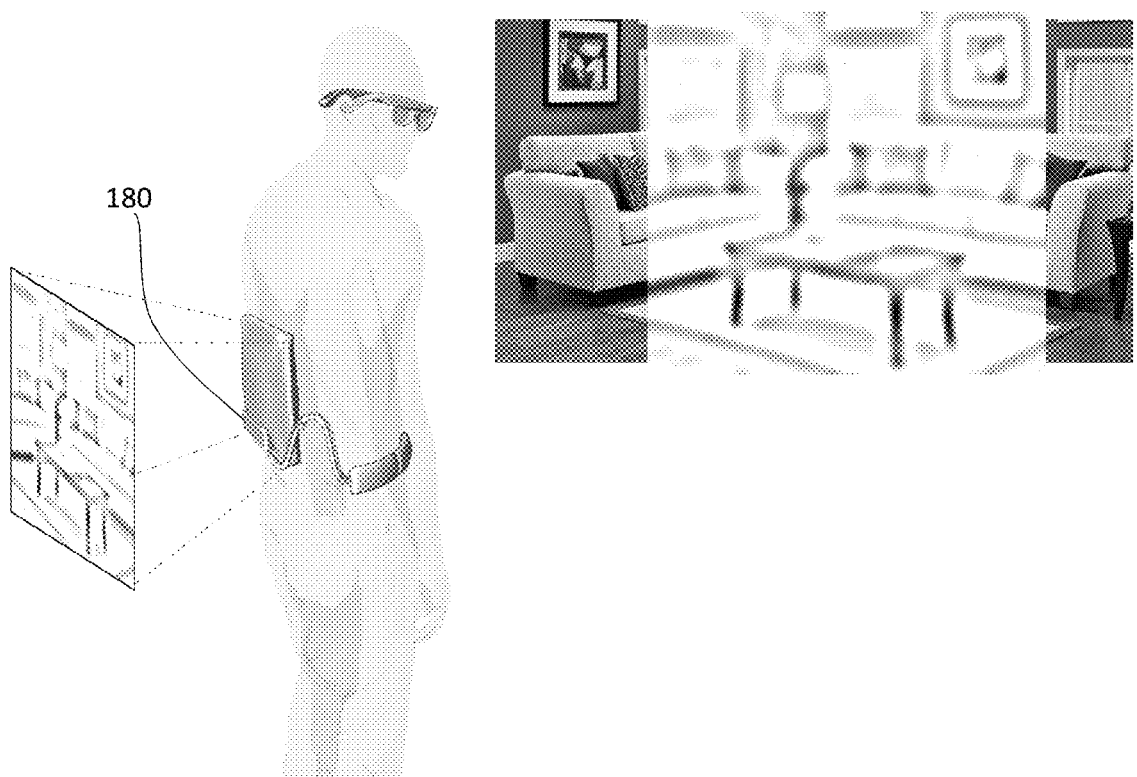
FIG. 10 is a back perspective view of an embodiment of the invention used as a vision system for the blind.
Figure 11:
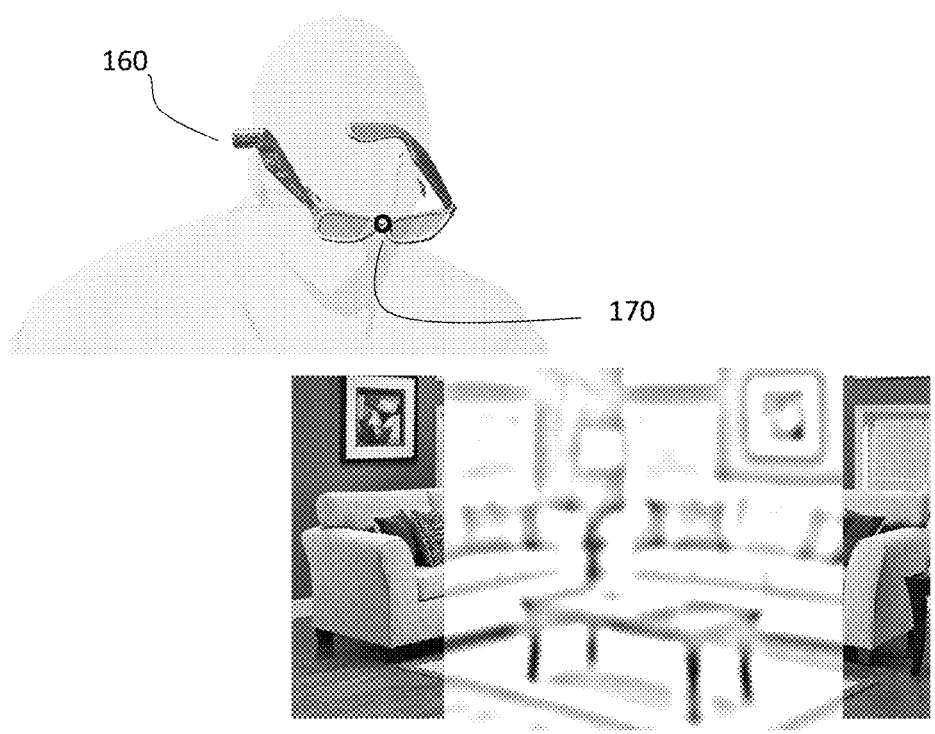
FIG. 11 is a top perspective view of the glasses and camera systems of the embodiment of FIG. 10.
Figure 12:
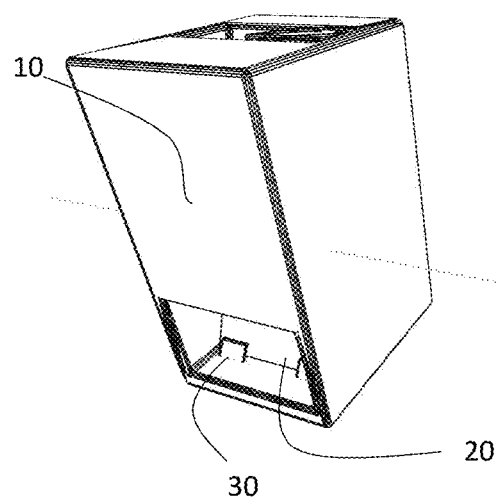
FIG. 12 is a front perspective view of an embodiment of an air valve in accordance with the invention.
Figure 13:
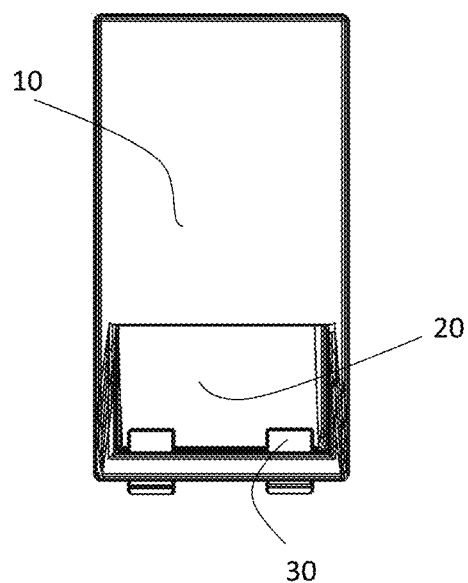
FIG. 13 is a front view of the air valve embodiment of FIG. 12.
Figure 14:
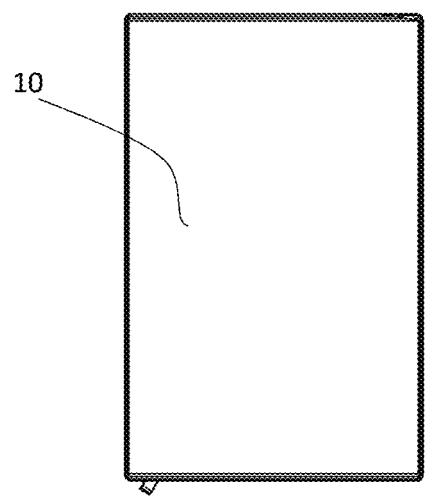
FIG. 14 is a side view of the air valve embodiment of FIG. 12.

FIGS. 10 and 11 further represent an embodiment of a vision system for the blind comprising the embodiment of FIGS. 5 to 9:

a. A user uses the camera 170 installed on the glasses 160 or on the cap to capture an image of the surroundings.

b. The camera 170 registers the image in movement in front of the user and sends it via Bluetooth or wireless 180 type technology to a computer attached to a Matrix.

c. The signal from the camera is received by the image processing system (computer) that applies special filters to make the image fit the requirements of the matrix. In the absence of a stand-alone live camera 170, the system, through a mobile application, may use other video sources (such as the camera of a mobile phone) to supply the user with the required video images.

d. Once the image is filtered and adapted, it is sent to the matrix that converts the image into a series of electric signals that open and close the air valves 90 (FIGS. 12-17) making an exact mapping of the image right on the surface of the user's skin as shown on FIG. 10.

e. The skin, then, is sensitized by the air flow formation escaping out through the opened valves 90 thanks to the difference in air pressure between the hyperbaric chamber 110 and the atmosphere. (FIGS. 5 to 9).

f. The air pressure is provided by a compressed air tank 140 and/or a battery-operated 150 air compressor 140. This process is repeated for every single image of the live-video feed captured by the camera 170.

g. The user perceives the air-jets formations on the skin and proceeds to scan the surroundings moving the head from left to right and up and down. The aggregate perception of the air-jet formations on the skin matching the movements of the user will create a comprehensive scenario of the surroundings in the user's brain (FIG. 10).

This embodiment, shown on FIG. 11, is preferably composed of a frame similar to a sun visor or glasses 160 that may incorporate or support a video camera 170, a compact image processing unit and an air valve matrix in contact with the skin. All systems are preferably interconnected by WIFI technology, Bluetooth or similar wireless technology 180 and may be integrated with clothing accessories so that they may be perfectly portable and comfortable.

Figure 18:
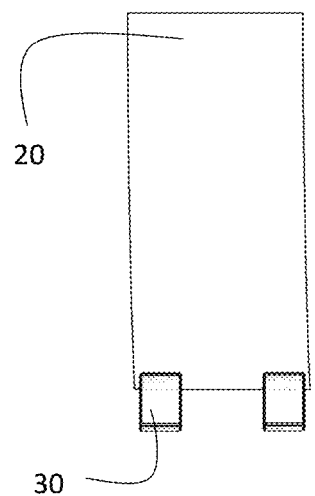
FIG. 18 is a front view of an embodiment of a piezoelectric sheet.
Figure 19:
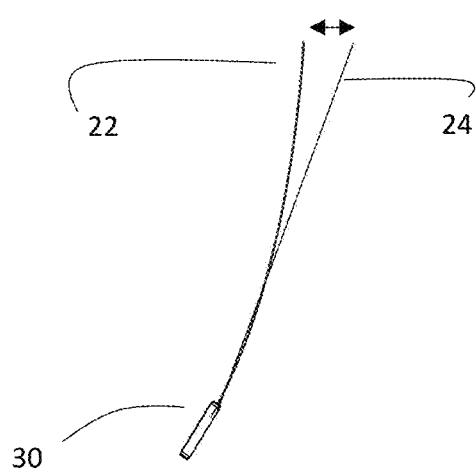
FIG. 19 is a side view of the piezoelectric sheet embodiment of FIG. 18, shown in opened and closed configurations.

In an embodiment, shown in FIGS. 12 to 17, a micro piezoelectric air valve comprises one air channel with one input 50 and one output 40 built in a case 10 made of an appropriate material such as plastic or any other similar material. The case 10 may further have varying dimensions and may be shaped differently than the rectangular embodiment shown. A piezoelectric sheet 20, shown in FIGS. 18 and 19, is installed inside the valve and may open 22 or close 24 an air channel upon reception of an electric signal. Said design is meant to adjust the time response for opening 22 and closing 24 requests so the air flows enough to sensitize the skin of the user. The design of the sheet 20 may be adjusted to optimize the time response for opening 22 and closing 24 requests so the air flow may properly be felt on a user's skin, without risking desensitisation. A valve's channels may also have different shapes, as long as they fit inside the confines of the valve and that they may properly allow air to flow as what is described above. In that regard, the piezoelectric sheet 20 may also have variable shapes in order to fit inside the valve's channels and properly function as is described above. In further embodiments, a case 10 may house more than one air channel and piezoelectric sheet 20. Such embodiments may allow more complex control of the exhaust 40 airflow or may allow the valve to keep working at a reduced output even when one or more of its channels or sheets 20 are damaged.

Figure 20:
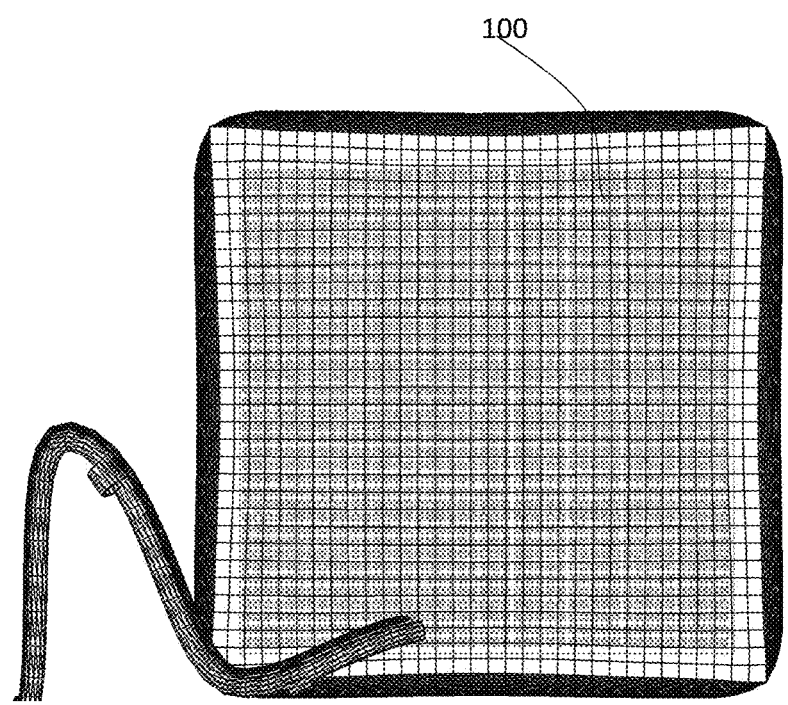
FIG. 20 is a front view of an embodiment of the PCB and valve arrays installed in a body suit.
Figure 21:
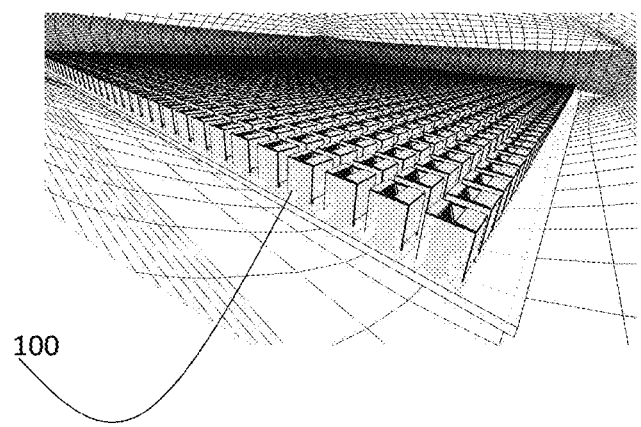
FIG. 21 is a perspective view of the PCB and valve arrays of the embodiment of FIG. 20 viewed from inside the body suit.
Figure 22:
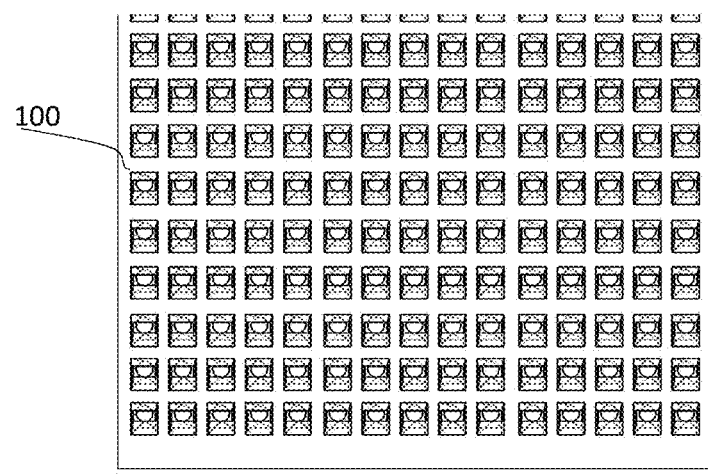
FIG. 22 is a top view of the PCB and valve arrays of the embodiment of FIG. 20.

As seen in FIGS. 20 to 22, a valve may be designed to be attached to, or simply installed next to, other valves of a similar design, side by side, and mounted over a printed circuit board (PCB) or a flexible printed circuit fabric (PCF). The size of the valve may preferably be less than a centimeter wide, but is not limited hereto.

Similarly to the embodiment of FIGS. 1 to 4, an elastic piece of fabric 80 the shape of a bubble may be attached to the air exhaust 40 side of an air valve. The bubble 80 may get inflated and deflated as the air valve is operated to be opened 22 and closed 24 respectively. When the valve is opened 22, the bubble element 80 may leak less air than it may receive. Thus it may be fully inflated while the valve is opened 22 and may gradually deflate when the valve is closed 24. The design of such inflatable elastic bubbles 80 is intended to provoke pressure sensations to the user over small areas of its skin, respectively the areas in contact with said bubbles 80.

In still another embodiment, which may be seen on FIGS. 20 to 22, a structure 100 is built out of aggregating micro piezo electric air valves, described above, in the shape of a bi-dimensional matrix of M×N elements. M being any number desired by a user in width of the matrix and N being another number desired by a user in height of the same. Such micro air jet piezoelectric valves matrix may be mounted on a flexible electronic printed circuit board (PCB), or printed circuit fabric (PCF), able to identify each valve in the matrix and operate it individually for opening and closing operations.

Figure 15:
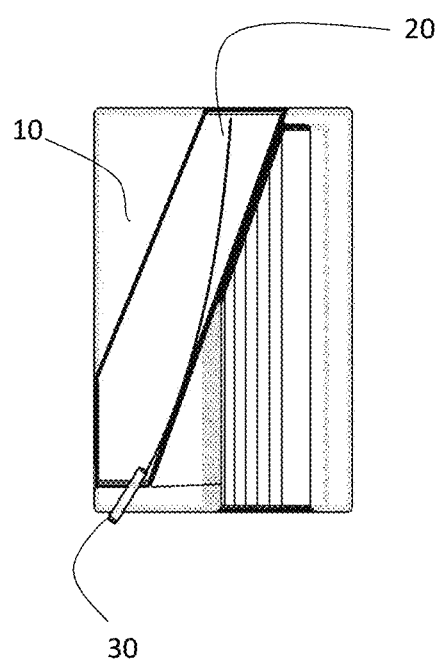
FIG. 15 is a side sectional view of the air valve embodiment of FIG. 12, sectioned at the middle of the valve.
Figure 16:
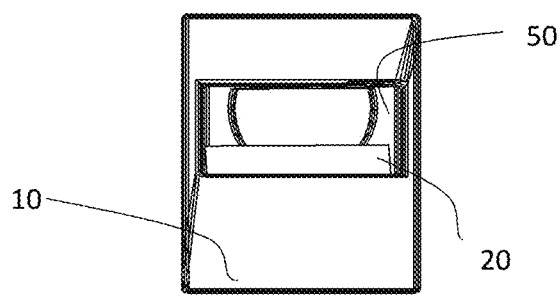
FIG. 16 is a top view of the air valve embodiment of FIG. 12.
Figure 17:
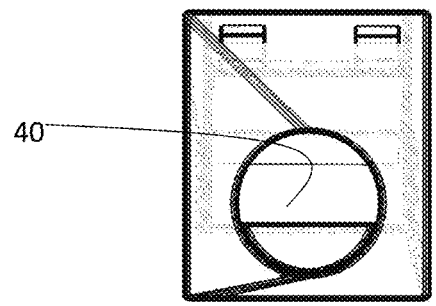
FIG. 17 is a bottom view of the air valve embodiment of FIG. 12.

Back to FIG. 15, electric current may flow through a piezoelectric sheet 20 with the help of electric connectors 30 in connection with the sheet 20 itself and the PCB or PCF 100. The PCB or PCF 100 may generally be supplied electricity by a power supply 150, such as a battery pack. The quantity of electric connectors 30 per piezoelectric sheet 20 and their positioning may vary and is not limited to what is shown. In the embodiment of FIG. 15, two electric connectors 30 are situated at the bottom of a valve. Furthermore, when the sheet 20 receives electrical current from its electric connectors 30, its material may be displaced accordingly so that the sheet 20 may block the airflow from the initial air channel to allow passage of air into the other channel. Still in the embodiment of FIG. 15, the sheet 20 is shown in a closed position 24; the air is blocked from leaving through the exhaust orifice 40 and must thus stay in the body suit by following the other channel. Would the sheet of FIG. 15 be activated by receiving current from its electric connectors 30, it would tense upwards in order to now block the prior air flow channel and allow passage of air into and out of the exhaust orifice 40. It may further be possible to regulate the intensity of the air flow leaving the exhaust orifice 40. To do so, the current going through the piezoelectric sheet 20 may be varied and the sheet's 20 positioning may then divide the incoming air flow into each air channel. Consequently, the pressure from the exhaust 40 air flow may be reduced or increased.

In yet another embodiment shown in FIGS. 5 to 9 and 20, a combination of a hyperbaric chamber 110 and the bi-dimensional matrix 100 of micro air valves is provided wherein said piezoelectric air jet valve matrix 100 is housed inside a hyperbaric chamber 110 in a way that the air inputs 50 of the valves are inside the interior of the chamber 110 while the exhaust side of the valves are outside the chamber 120 facing the skin of the user. The air may flow from inside the chamber 110 out to the skin of the user through the opened valves and their respective air outlet orifices 120 thanks to difference in air pressure.

In another embodiment not shown, a system is provided with a compact computer unit 180 that applies specific filters on an image received from external devices. Images may preferably be transferred through WIFI/Bluetooth or similar wireless communication technologies to enhance image features before it is released to the micro piezoelectric valve matrix 100 to which it is connected through the PCB or PCF.

In another embodiment not shown, a system comprises: an image source, a computer unit for image processing 180, an hyperbaric chamber 110 for pressurized air, a series of piezoelectric air jet valves mounted in a matrix formation on the PCB 100 and the required battery pack 150 and air supply 140 necessary to sensitize the skin of a user by means of air pressure difference and electronic selective valve activation that may cause air jet formations over the skin following the pattern of the homolog pixels of the processed image.

Figure 23:
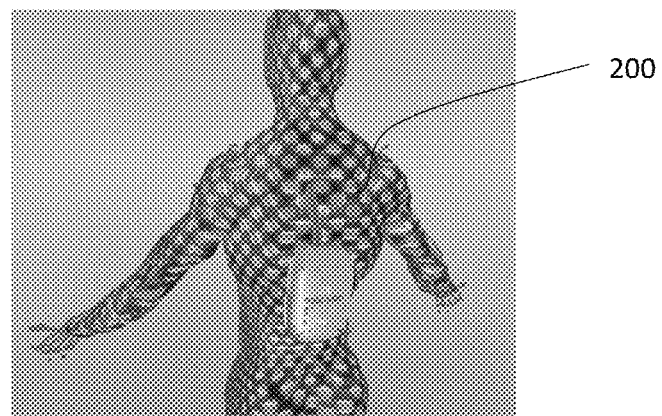
FIG. 23 is a back perspective view of a sensorial suit embodiment comprised of multiple cloth cluster cells.

In another embodiment seen in FIG. 23, a sensorial suit 200 is provided that may cover a majority of a user's skin and is built out of joining micro air jet valve matrix units, respectively the embodiment shown in FIGS. 1 to 4, interconnected with data wires, power wires and compressed air distribution tubes. The micro air jet valve matrix units may be joined by any way known in the art. The sensorial suit 200 may be equipped with compressed air supply, power supply and computer graphic units connected wirelessly with external data supply devices. The suit 200 may maintain a stable pressure in all matrix elements in operation. The inside layer of the suit 200 may emit air jet formations and pressure bubble formations on the skin of the user, following the patterns of the homolog pixels of the image processed by the system.

A further embodiment, not shown in the presented figures, may combine the embodiments presented above with therapeutic treatments. The therapeutic treatments may be used to stimulate certain body parts of a living being or simply relax it. In such an embodiment, a device comprising a piezoelectric air jet valve matrix mounted on a PCB or PCF 100, a battery pack 150 and an air supply 140 may be installed on one or multiple specific body parts to help stimulate or relax them. The device may be in communication with a computerized device comprising a software capable of applying sequences of treatments. The sequences of treatment may be manually configured by a person or may be chosen from a predetermined set of available treatment types. Such an embodiment might thus be used by the general populace for relaxing treatments or by medical professional for treatments related to health issues.

In yet another embodiment, not shown in the presented figures, a device comprising a piezoelectric air jet valve matrix mounted on a PCB or PCF 100, a battery pack 150 and an air supply 140 may be installed on an animal, most commonly a house pet. The device may be in communication with a computerized device, such as a smart phone, and may receive and send information to it. Thus, the user in control of the computerized device may control the operation of the body suit device. For example, a dog owner may stimulate his dog to react to certain visual or audio stimuli with the addition of the temperature and tactile feedback from the device. The embodiment may further comprise a camera 170 in communication the computerized device. An algorithm in the computerized device may then analyse the received visual information and activate the body suit when certain conditions are met. For example, the algorithm may activate temperature and pressure stimuli of the body suit when an animal is facing a visual marker, such as the entrance of a restricted zone.

In another embodiment not shown in the figures, a computerized device in communication with a device comprising at least a piezoelectric air jet valve matrix mounted on a PCB or PCF 100 may be used to send valve activation patterns to it. The patterns may be manually drawn on the computerized device by a user or selected from a bank of available activation patterns. For example, a user may draw patterns with his fingers on a tablet and corresponding piezoelectric air jet valves would be activated.

While illustrative and presently preferred embodiments of the invention have been described in detail hereinabove, it is to be understood that the inventive concepts may be otherwise variously embodied and employed and that the appended claims are intended to be construed to include such variations except insofar as limited by the prior art.

The invention claimed is:

1. A valve system for a skin interface system, the valve system comprising:
   a hyperbaric chamber comprising:
   a first piece of fabric adapted to be in contact with the user's skin; and
   a second piece of fabric opposite to the first piece of fabric;
   a bi-dimensional matric of M×N elements of valves mounted on a flexible electronic printed circuit board (PCB) or printed circuit fabric (PCF), the bi-dimensional matrix being positioned within the hyperbaric chamber to exhaust air toward the skin of a user; and
   elastic pieces of fabric the shape of a bubble installed over an output orifice of a certain amount of the total quantity of the valves, the elastic pieces of fabric being in contact with the user's skin when fully inflated,
   wherein pressurized air is supplied between the first and second pieces of fabric, the valves are electrically powered, and
   the valve system is configured to individually open and close each of the valves in the bi-dimensional matrix such that the elastic pieces of fabric get inflated and deflated as the valves are opened and closed.

2. The valve system as claimed in claim 1, wherein the elastic piece of fabric remains inflated while the valve is opened and gradually deflates when the valve is closed, the inflation and the deflation inducing pressure sensation on the skin of the user.

3. The valve system of claim 1, the valves having a width of less than 1 cm.

4. The valve system of claim 1, the elastic pieces of fabric being installed over the output orifice of the total quantity of the valves.

5. The valve system of claim 1, the valves being piezo-electric valves.

6. The valve system of claim 5, the piezo-electric valves being micro piezo-electric valves.

7. The valve system of claim 5, the system further comprising a portative power supply feeding the piezo-electric air valves.

8. The valve system as claimed in claim 1, further comprising a computerized unit connected to the bi-dimensional matrix through the PCB or PCF and in data communication with external imaging devices, the computerized unit being configured to:
   apply specific filters to an image received from the external imaging devices;
   to enhance features of the image;
   to communicate the enhance image to the bi-dimensional matrix.

9. The valve system of claim 8, the computerized device being in wireless communication with the external imaging devices.

10. The valve system as claimed in claim 8, further comprising an air supply source connected to the valves providing variable air pressure levels, the system being configured to electronically and selectively activate of one or more of the valves of the bi-dimensional matrix to form air jet over the skin of the user following pattern of homolog pixels of the enhanced image.

11. The air valve system of claim 10, the system comprising a plurality of bi-dimensional matrixes of valves, each of the plurality of bi-dimensional matrices being in fluid communication with the one or more other bi-dimensional matrices, the connected bi-dimensional matrices forming a sensorial suit adapted to cover a substantial portion of the skin of the user.

12. The valve system of claim 8, the external imaging devices being image sensors.

13. The valve system of claim 12, the system further comprising glasses, the image sensors being attached to the glasses.

* * * * *